(12) United States Patent
Daikoku et al.

(10) Patent No.: US 9,631,295 B2
(45) Date of Patent: Apr. 25, 2017

(54) METHOD FOR PRODUCING SIC SINGLE CRYSTALS BY CONTROL OF AN ANGLE FORMED BY THE MENISCUS AND THE SIDE FACE OF THE SEED CRYSTAL AND PRODUCTION DEVICE FOR THE METHOD

(75) Inventors: Hironori Daikoku, Susono (JP); Kazuhito Kamei, Chiyoda-ku (JP)

(73) Assignees: TOYOTA JIDOSHA KABUSHIKI KAISHA, Toyota-shi (JP); NIPPON STEEL & SUMITOMO METAL CORPORATION, Tokyo (JP)

(*) Notice: Subject to any disclaimer, the term of this patent is extended or adjusted under 35 U.S.C. 154(b) by 682 days.

(21) Appl. No.: 14/006,640

(22) PCT Filed: Jul. 27, 2011

(86) PCT No.: PCT/JP2011/067715
§ 371 (c)(1),
(2), (4) Date: Sep. 20, 2013

(87) PCT Pub. No.: WO2012/127703
PCT Pub. Date: Sep. 27, 2012

(65) Prior Publication Data
US 2014/0007807 A1    Jan. 9, 2014

(30) Foreign Application Priority Data

Mar. 23, 2011  (JP) .................. 2011-063772
May 16, 2011   (JP) .................. 2011-109837

(51) Int. Cl.
*C30B 15/22*    (2006.01)
*C30B 29/36*    (2006.01)
(Continued)

(52) U.S. Cl.
CPC ............. *C30B 15/22* (2013.01); *C30B 17/00* (2013.01); *C30B 19/04* (2013.01); *C30B 19/061* (2013.01);
(Continued)

(58) Field of Classification Search
CPC ......... C30B 15/00; C30B 15/20; C30B 15/22; C30B 15/26; C30B 19/00; C30B 19/02;
(Continued)

(56) References Cited

U.S. PATENT DOCUMENTS

| 5,078,830 A | 1/1992 | Shirata et al. |
| 2006/0292057 A1* | 12/2006 | Nakamura ............. C30B 9/00 423/446 |

(Continued)

FOREIGN PATENT DOCUMENTS

| CN | 101203635 A | 6/2008 |
| CN | 101421442 A | 4/2009 |

(Continued)

OTHER PUBLICATIONS

International Search Report issued Oct. 25, 2011 in PCT/JP2011/067715.
(Continued)

*Primary Examiner* — Kenneth A Bratland, Jr.
(74) *Attorney, Agent, or Firm* — Oblon, McClelland, Maier & Neustadt, L.L.P.

(57) ABSTRACT

Provided is a method for producing SiC single crystals while maintaining a temperature gradient such that the temperature decreases from within an Si solution inside a graphite crucible toward the solution surface, with the SiC seed crystals that have contacted the solution surface serving as the starting point for crystal seed growth, wherein when the crystal growth surface of the SiC seed crystals, which serves as the starting point for SiC single crystal growth, contacts
(Continued)

the solution surface, the height by which the solution rises to the side of the SiC seed crystals is within the range where the SiC single crystals that have grown from the crystal growth surface and the SiC single crystals that have grown from the side grow as one SiC single crystal unit. Also provided is a device for producing an SiC single crystal comprising a graphite crucible, a heating device for heating and melting base materials in the crucible to form a base material solution and maintaining a temperature gradient required for growth of SiC single crystal, a support rod which holds a SiC seed crystal at its bottom end, and a holding structure which maintains the holding by the support rod so that a height by which the solution rises to the side of the SiC seed crystal is within a range where the SiC single crystal that have grown from the crystal growth surface and the SiC single crystal that have grown from the side grow as one SiC single crystal unit.

12 Claims, 11 Drawing Sheets

(51) Int. Cl.
    *C30B 19/04*     (2006.01)
    *C30B 19/06*     (2006.01)
    *C30B 19/12*     (2006.01)
    *C30B 17/00*     (2006.01)

(52) U.S. Cl.
    CPC .............. *C30B 19/12* (2013.01); *C30B 29/36* (2013.01); *Y10T 117/1032* (2015.01)

(58) Field of Classification Search
    CPC ......... C30B 19/04; C30B 19/08; C30B 19/10; C30B 19/12; C30B 29/36; C30B 30/00; C30B 30/06; Y10T 117/00; Y10T 117/10; Y10T 117/1008; Y10T 117/1012; Y10T 117/1024; Y10T 117/1032; Y10T 117/1068
    USPC ... 117/11, 13–15, 19, 30, 35, 54–55, 60, 63, 117/73–74, 200–202, 206, 208, 218, 902, 117/937, 951
See application file for complete search history.

(56) References Cited

U.S. PATENT DOCUMENTS

| | | |
|---|---|---|
| 2009/0064923 A1 | 3/2009 | Takanashi |
| 2009/0084309 A1* | 4/2009 | Sakamoto .............. C30B 29/36 117/73 |
| 2009/0101062 A1 | 4/2009 | Sakamoto |

FOREIGN PATENT DOCUMENTS

| | | | |
|---|---|---|---|
| JP | 3-50180 A | 3/1991 | |
| JP | 4-321590 A | 11/1992 | |
| JP | 2000-264790 A | 9/2000 | |
| JP | 2003-512282 A | 4/2003 | |
| JP | 2007-197231 A | 8/2007 | |
| JP | 2009-57216 A | 3/2009 | |
| JP | 2010-184838 A | 8/2010 | |
| JP | 2010184838 A * | 8/2010 | |
| JP | 2011-105525 A | 6/2011 | |
| WO | WO 01/29292 A1 | 4/2001 | |

OTHER PUBLICATIONS

Office Action issued Feb. 1, 2017 in European Patent Application No. 11861383.5 filed Jul. 27, 2011.
Vitali A. Tatartchenko, "Part B/16.8 Crystal Growth from Melt Techniques", Springer Handbook of Crystal Growth, Oct. 20, 2010, pp. 546-551, XP055339294, DOI: 10.1007/978-3-540-74761-1_16 ISBN:978-3-540-74761-1.

* cited by examiner

Fig. 1 (PRIOR ART)
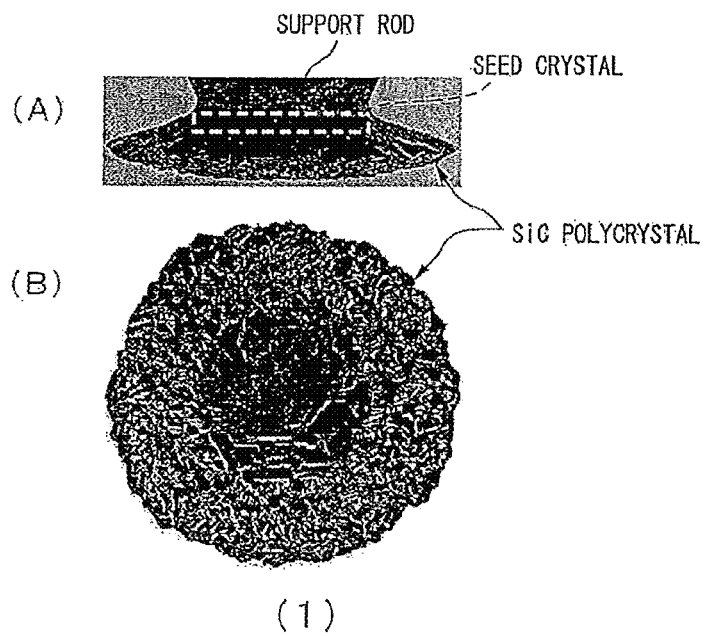
(1)
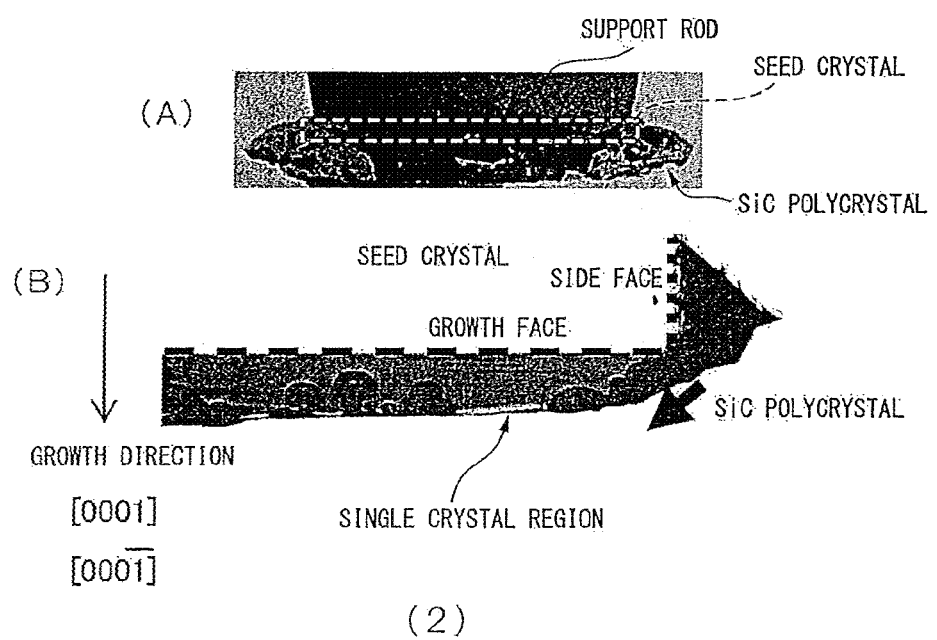
(2)

Fig.5
(1)
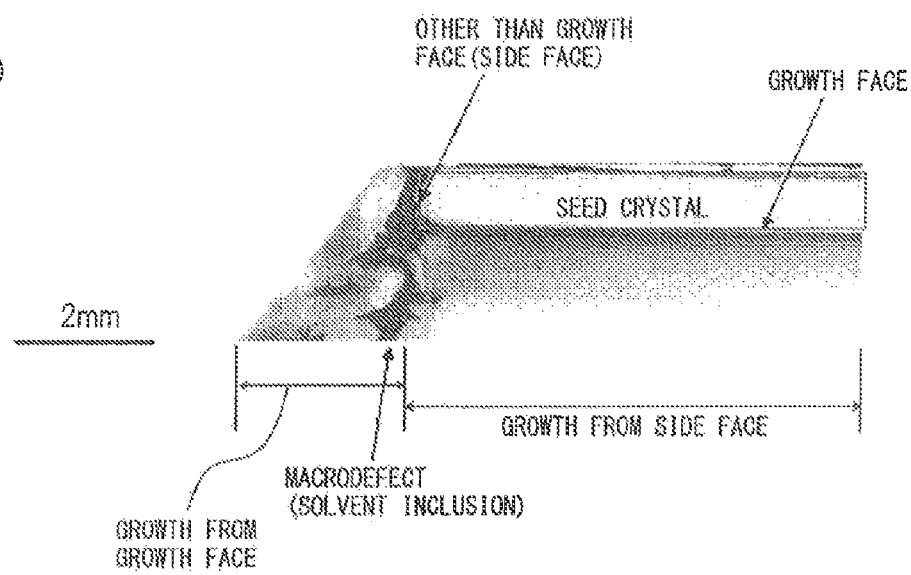
(2) 0.3mm WETTING
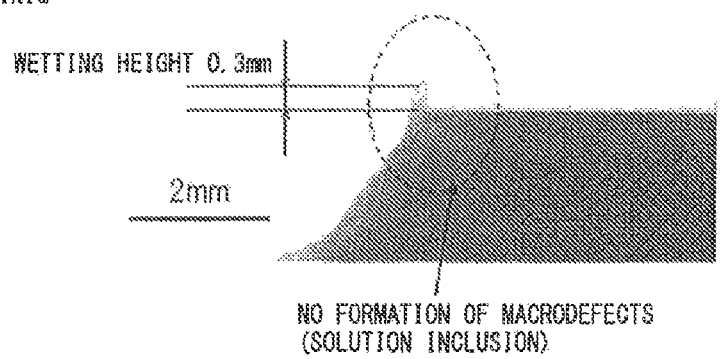
(3) NO WETTING
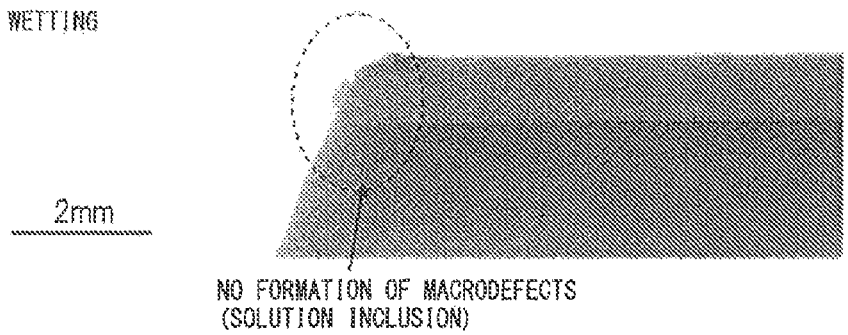

Fig.14
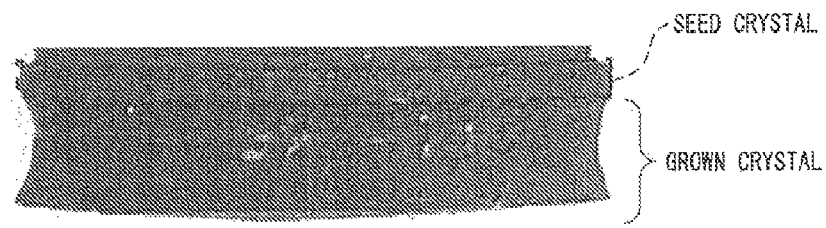
Fig.15
(1) 0mm
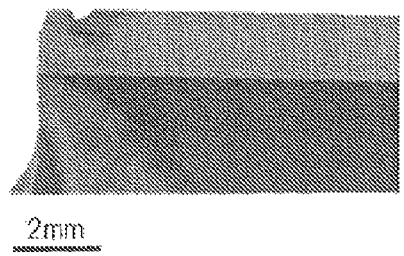
(2) 0.3mm
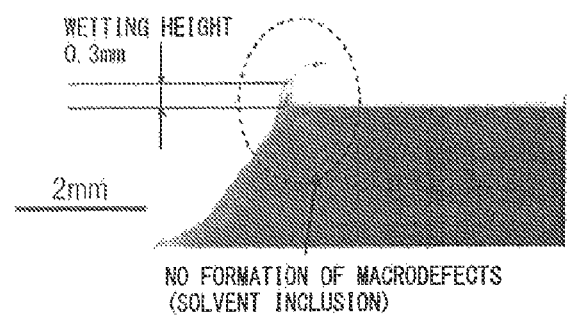
NO FORMATION OF MACRODEFECTS
(SOLVENT INCLUSION)
(3) 0.68mm
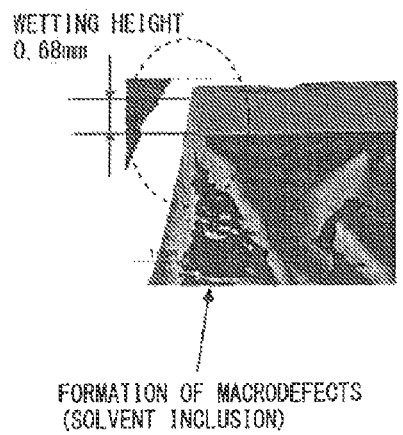
FORMATION OF MACRODEFECTS
(SOLVENT INCLUSION)
(4) 0.9mm
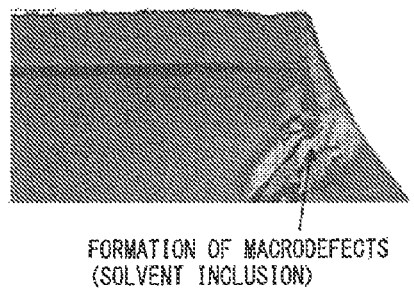
FORMATION OF MACRODEFECTS
(SOLVENT INCLUSION)

US 9,631,295 B2

METHOD FOR PRODUCING SIC SINGLE CRYSTALS BY CONTROL OF AN ANGLE FORMED BY THE MENISCUS AND THE SIDE FACE OF THE SEED CRYSTAL AND PRODUCTION DEVICE FOR THE METHOD

CROSS-REFERENCE TO RELATED APPLICATIONS

This application is a national phase application of International Application No. PCT/JP2011/067715, filed Jul. 27, 2011, and claims the priority of Japanese Application Nos. 2011-063772, filed Mar. 23, 2011, and 2011-109837, filed May 16, 2011, the content of all of which is incorporated herein by reference.

TECHNICAL FIELD

The present invention relates to a method of production and system of production of an SiC single crystal by the solution method.

The method of production of an SiC single crystal by the solution method maintains a temperature gradient in an Si solution inside a graphite crucible where the temperature falls from the inside toward the solution surface from the bottom to the top. At the bottom high temperature part, the C which dissolves from the graphite crucible to the inside of the Si solution mainly rises while riding the convection current of the solution, reaches the low temperature part near the solution surface, and becomes supersaturated. At the tip of the support rod (graphite), an SiC seed crystal is held. The bottom surface of the seed crystal is brought into contact with the solution as a crystal growth face, whereby an SiC single crystal grows by epitaxial growth from the supersaturated solution on the crystal growth face of the seed crystal.

However, a large number of crystals grow in a scattered manner from the surfaces other than the bottom surface (crystal growth face) of the seed crystal (side faces etc. of seed crystal) or from the graphite rod whereby polycrystallization easily occurs. There was the problem that the polycrystals which formed invaded the region of the single crystal and obstructed long growth or the diameter expanding step.

That is, as shown in FIG. 1, SiC polycrystals end up forming so as to bulge outward from the side faces of the seed crystal which is held at the bottom end of the support rod. In FIG. 1(1), (A) is a front view while (B) is the bottom surface. These show that SiC polycrystals bulge outward like an umbrella covering the seed crystal shown by the broken line as a whole. FIG. 1(2) is a similar example, wherein (A) is a front view while (B) is a vertical cross-sectional view. In particular, as shown in (B), it is learned that SiC polycrystals (black parts) which grow from the side faces of the seed crystal cover up to the region of the single crystal (light gray) which grows at the crystal growth face of the seed crystal shown by the broken line (the bottom surface).

In this way, once the solution ends up wetting portions other than the crystal growth face of the seed crystal (side faces of seed crystal and support rod), a large number of crystal nuclei end up being formed from the wet portions and polycrystallization (3D growth) ends up occurring.

Furthermore, unlike solution growth of an Si single crystal, in the case of solution growth of an SiC single crystal, with growth from a crystal face other than the c face ([0001] face or [000-1] face), a high quality SiC single crystal cannot be obtained, so the issue of formation of polycrystals from faces other than the crystal growth face of the c face can be said to be an issue unique to solution growth of an SiC single crystal.

Japanese Patent Publication No. 4-321590A discloses to make at least the part of the seed crystal which contacts the solution a substantially cylindrical shape so that the inclination angle of a meniscus which is formed between the seed crystal and the solution no longer varies much at the outer circumference of the seed crystal and formation of crystal defects right under the seed crystal can be suppressed.

However, with the method of PLT 1, a large number of polycrystals grow in a scattered manner from the faces of the seed crystal other than the crystal growth face or from the graphite rod and polycrystallization occurs. This phenomenon is not considered at all.

Polycrystallization cannot be prevented.

SUMMARY OF INVENTION

The present invention has as its object the provision of a method of production of an SiC single crystal by the solution method, which method of production of an SiC single crystal prevents a large number of crystals growing in a scattered manner from faces of the seed crystal other than the crystal growth face or from a graphite rod which supports the seed crystal, that is, polycrystallization, and a system of production by the same.

The object, according to the present invention, is achieved by a method of production of an SiC single crystal which uses an Si—C solution in a crucible to grow an SiC single crystal using an SiC seed crystal which has been brought into contact with that solution surface as a starting point, the method of production characterized by, when bringing the crystal growth face of the SiC seed crystal which forms the starting point of growth of the SiC single crystal into contact with the solution surface, making the wetting height of the solution to the side faces of the SiC seed crystal within the range where the SiC single crystal which grows from the crystal growth face and the SiC single crystal which grows from the side faces grow as an integral SiC single crystal.

Further, this object is achieved by a system for production of SiC single crystal which performs the method of production of an SiC single crystal of the present invention, the system comprising:

a graphite crucible for holding a base material solution, a heating device for heating and melting base materials in the crucible to form a base material solution and maintaining a temperature gradient required for growth of the SiC single crystal, a support rod which holds a seed crystal at its bottom end, and a holding structure which maintains the holding by the support rod so that a wetting height of the solution to the side faces of the SiC seed crystal becomes within the range where the SiC single crystal which grows from the crystal growth face and the SiC single crystal which grows from the side faces grow as an integral SiC single crystal.

According to the present invention, when bringing the crystal growth face of the SiC seed crystal which forms the starting point of growth of the SiC single crystal into contact with the solution surface, the wetting height of the solution to the side faces of the SiC seed crystal is made within the range where the SiC single crystal which grows from the crystal growth face and the SiC single crystal which grows from the side faces grow as an integral SiC single crystal, so it is possible to prevent polycrystallization due to crystal growth from other portions of the seed crystal or from the graphite rod which supports the seed crystal.

BRIEF DESCRIPTION OF THE DRAWINGS

FIG. 1 is a photograph which shows formation of polycrystals in the prior art.

FIG. 5 is a photograph which shows the presence of macrodefects in a grown SiC single crystal for the cases of wetting heights to the seed crystal side faces of (1) 1 mm, (2) 0.3 mm, (and 3) 0 mm.

FIG. 14 is a photograph which shows an SiC single crystal which was grown according to the method of the present invention.

FIG. 15 is a photograph which shows an SiC single crystal which was grown while changing the wetting height.

DESCRIPTION OF EMBODIMENTS

Figure 2:
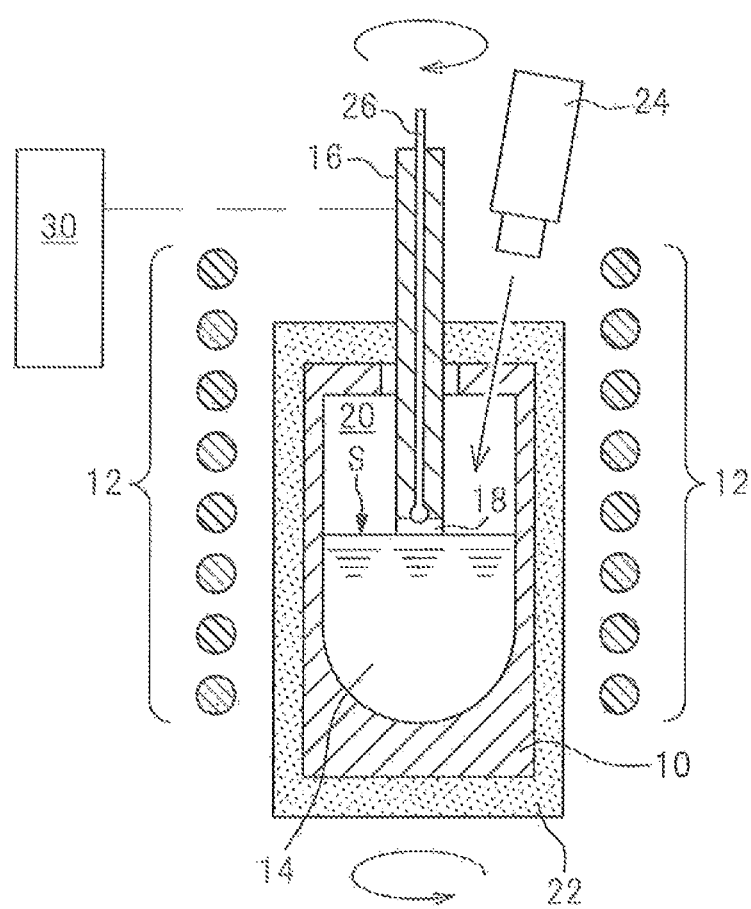
FIG. 2 is a schematic view which shows the basic configuration of a system which produces an SiC single crystal by the method of the present invention.

FIG. 2 shows the basic structure of a system of growth of an SiC single crystal by the solution method which is suitable for performing the method of the present invention.

A high frequency heating coil 12 which surrounds a graphite crucible 10 is used to heat and melt the base materials in a crucible 10 to form a solution 14. An SiC seed crystal 18 which is supported above that at the bottom end of the graphite support rod 16 is brought into contact with the solution surface S of the solution 14 to form an SiC single crystal at the bottom face of the SiC seed crystal 18 in an Ar gas or other inert atmosphere 20.

The graphite crucible 10 is covered overall by a heat insulating material 22. The temperature of the solution surface S is measured by a radiant thermometer 24 by a non-contact method, while the temperature of the back surface of the seed crystal 18 is measured by an W—Re or other thermocouple 26 by the contact method.

A CCD camera (not shown in FIG. 2) is set at an observation window above the solution surface from which the solution surface S can be directly viewed. The solution surface S during SiC growth can be directly observed.

The radiant thermometer 24, like the CCD camera, is set at the observation window above the solution surface from which the solution surface S can be directly viewed and can measure the temperature of the solution surface before and after bringing the seed crystal 18 into contact with the solution 14.

The thermocouple 26 is fastened at its detecting end to the inside of the bottom end of the graphite support rod to which the seed crystal 18 is bonded (position about 2 mm from bonded surface of seed crystal 18) and can measure the seed crystal temperature from right after the seed crystal 18 is brought into contact with the solution 14.

In general, the graphite crucible 10 is charged with the base material of the Si solution, that is, Si. The high frequency heating coil 12 is used to heat this to form the Si solution. From the inside walls of the graphite crucible 10, C dissolves into this Si solution whereby a Si—C solution 14 is formed. In this way, the source of the C of the SiC is basically the graphite crucible 10, but it is also possible to supplementarily add a graphite block. Further, the crucible 10 may also be made of SiC. In this case, as the source of C, a graphite block must be added.

Depending on the case, to raise the growth rate, first, the graphite crucible 10 can be charged with not only Si, but for example Cr, Ni, etc. to form an Si—Cr solution, Si—Cr—Ni solution, etc.

The above configuration has been used in the past, but the present invention is further characterized in that a control device 30 is provided for growth while maintaining the wetting height of the solution to the side faces of the SiC seed crystal within the range where the SiC single crystal which grows from the crystal growth face and the SiC single crystal which grows from the side faces grow as an integral SiC single crystal. In a best mode, only the growth face of the seed crystal is brought into contact with the solution and the wetting height is made 0. The control device 30 is electrically and/or mechanically connected with a not shown solution surface height detector and seed crystal support rod drive apparatus and controls the height of the crystal growth face of the seed crystal from the solution surface to a suitable value at each instant.

The method of the present invention provides a method of growing an SiC single crystal by using a system of the basic configuration of FIG. 2 to maintain a temperature gradient in an Si solution in a graphite crucible where the temperature falls from the inside toward the solution surface while using the SiC seed crystal which is brought into contact with the solution surface as a starting point, characterized by bringing only the crystal growth face of the SiC seed crystal which forms the starting point of growth of the SiC single crystal into contact with the solution surface.

The characterizing feature of the present invention will be explained in comparison with the prior art.

Figure 3:
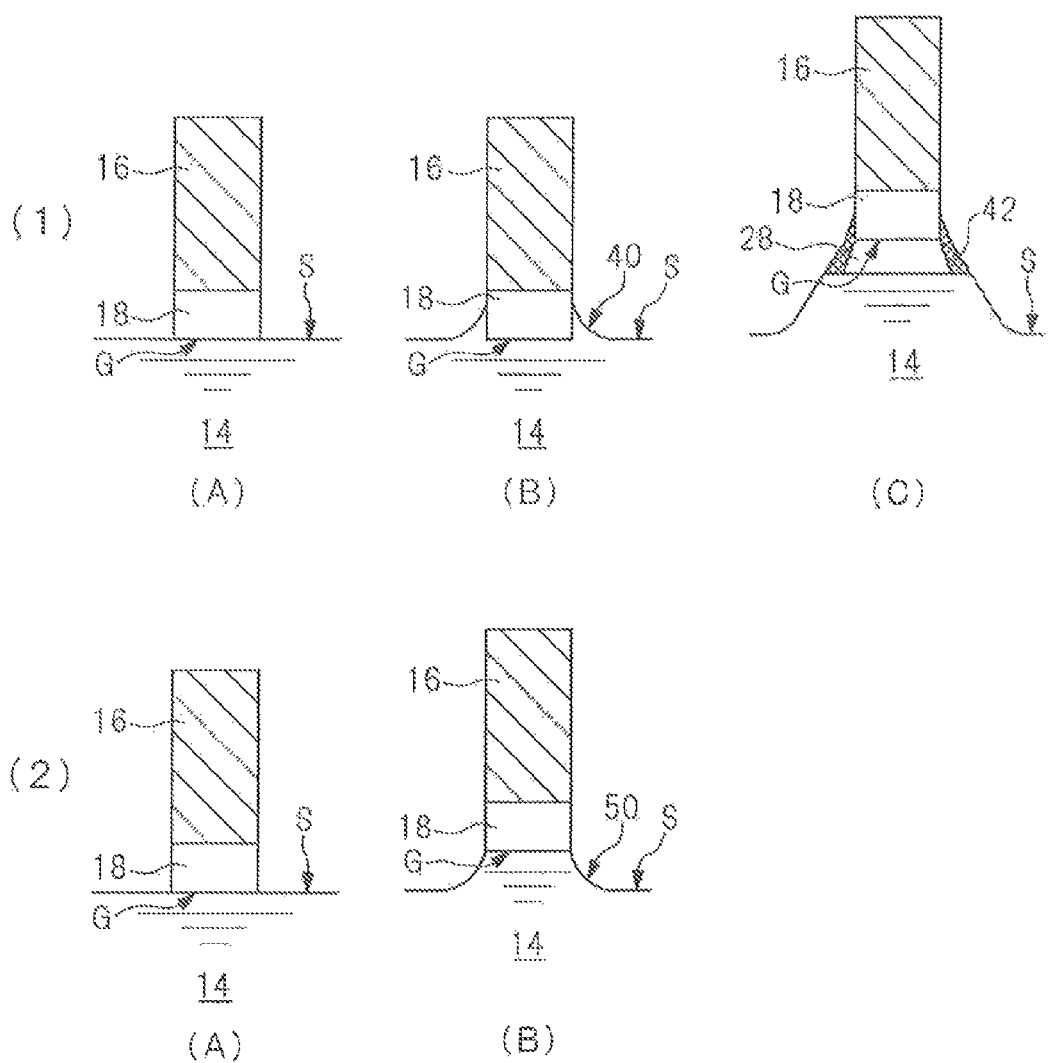
FIG. 3 is a schematic view which shows a comparison of the relationship between the seed crystal and solution surface in the prior art (1) and in a best mode of the present invention (2).

FIG. 3(1) schematically shows the relationship between the seed crystal and solution surface in the solution method of the prior art.

(A) First, the bottom end of the support rod 16 is made to hold the seed crystal 18, then the crystal growth face G is brought into contact with the solution surface S of the solution 14. At this time, as illustrated, the crystal growth face G and the solution surface S match or the crystal growth face G is slightly immersed in the solution 14 somewhat below the solution surface S.

(B) If held in this state, the solution 14 wets the side faces of the seed crystal 18 whereby, as illustrated, a meniscus 40 is formed.

(C) In the seed crystal 18, the bottom face is the preferential growth orientation [0001] or [000-1] crystal growth face, while the side faces are not the preferential growth orientation of the SiC single crystal, so from the parts contacting the side faces and forming the meniscus 40, polycrystals 42 comprised of a large number of single crystals with scattered orientations result. That is, polycrystallization such as shown in FIG. 1 occurs.

Therefore, the present invention controls the wetting height to the seed crystal side faces such as shown in (B) of FIG. 3(1) to prevent polycrystallization. In a best mode, the wetting height is made 0.

Figure 4:
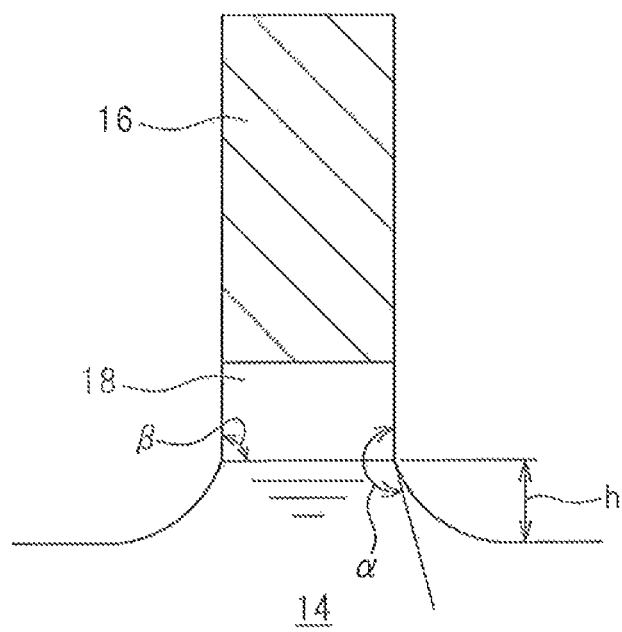
FIG. 4 is a schematic view which shows in detail enlarged the relationship between the seed crystal and solution surface in the present invention.

That is, in a best mode, as shown in FIG. 3(2), at the time of contact shown in (A), the crystal growth face G and the solution surface S are made to match and the crystal growth face G is strictly prevented from being immersed in the solution 14 below the solution surface S. In addition, preferably, immediately after the contact of (A) occurs (for example, within 2 minutes), some pull-up is performed (pull-up height "h": FIG. 4) and, as shown in (B), a meniscus 50 is formed between the crystal growth face G and the solution. That state is maintained to grow the SiC single crystal. More preferably, the contact angle α between the meniscus 50 and the side faces of the seed crystal 18 is 200 degrees or less. Due to this, it is possible to advantageously prevent polycrystallization.

In a general aspect, the crystal is grown while maintaining the wetting height of the solution to the side faces of the SiC seed crystal within the range where the SiC single crystal which grows from the crystal growth face and the SiC single crystal which grows from the side faces grow as an integral SiC single crystal. In many cases, the crystal which grows from the crystal growth face and crystal which grows from the side faces will not become integral along with macrodefects between them. This is the understanding from the past. As explained in the above best mode, only the crystal growth face has been brought into contact with the solution surface. Wetting of the side faces by the solution has been strictly avoided.

As opposed to this, as a new discovery by the present invention, it was observed that even if the wetting height is not necessarily 0, sometimes no macrodefects result and the crystal which grows from the side faces (side face crystal) and crystal which grows from the crystal growth face (main crystal) become integral. FIG. 5 shows one example.

FIG. 5(1) shows the case where the wetting height reaches the height of the seed crystal of 1 mm. Macrodefects occur between the side face crystal and main crystal, penetration by the solution (inclusions) end up occurring, and the side face crystal and main crystal grow as separate crystals. This not only causes polycrystallization, but also blocks expanded growth of the SiC single crystal. Expanded growth is essential for growing an SiC single crystal of a shape which has a practical straight barrel part.

FIG. 5(2) shows the case where wetting occurs up to a height of 0.3 mm at the side faces of the seed crystal, but the side face crystal and the main crystal grow as an integral single crystal without macrodefects.

FIG. 5(3) shows the case of the best mode of a wetting height of 0 mm, that is, the case where only the crystal growth face contacts the solution surface. No macrodefects are formed.

In this way, it is learned that there is an allowable range to the wetting height of a solution to the side faces of a seed crystal. Therefore, it is possible to run preliminary experiments to find the relationship between the formation of macrodefects and the wetting height and follow that relationship to adjust the pull-up height etc. to thereby grow the crystal in the allowable range of the wetting height. The existence of an allowable range in the growth parameters in this way is extremely significant from the viewpoint of industrial growth of an SiC single crystal.

In the present invention, preferably, the angle β formed by the crystal growth face G of the seed crystal 18 and the side faces (FIG. 4) is 90 degrees or less. Due to this, it is possible to advantageously prevent polycrystallization.

Preferably, the seed crystal 18 is pulled up to form a meniscus 50, then rotation of the seed crystal 18 with respect to the solution surface S is started. Due to this rotation, the temperature and composition of the solution become more uniform.

When the solution surface S is vibrating, this vibration is utilized to make the solution surface S and the crystal growth face G of the seed crystal 18 contact each other. In this case as well, it is possible to pull up the seed crystal 18 to form the meniscus 50 immediately after contact.

Furthermore, the shape of the bottom end of the support rod 16 which holds the seed crystal 18 is preferably not one where wetting by the solution 14 readily occurs.

Figure 6:
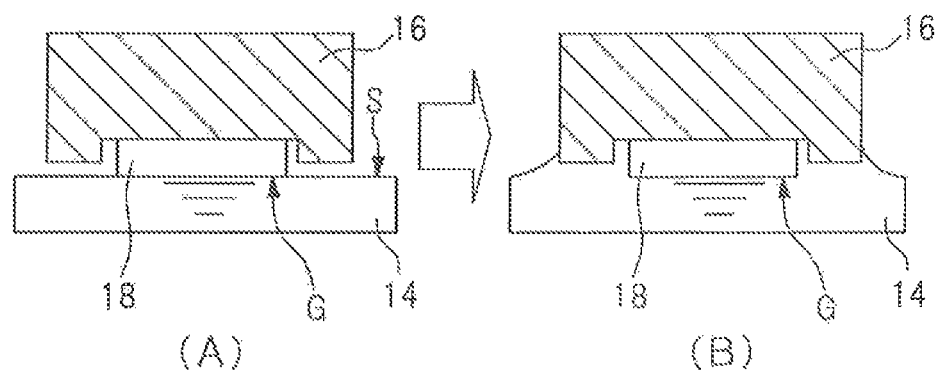
FIG. 6 is a schematic view which shows a typical example of a bottom end shape of a support rod where wetting by the solution easily occurs.

As a bad typical example, as shown in FIG. 6(A), if the seed crystal mounting part of the front end face of the support rod 16 is recessed, the other parts (projecting parts) of the front end face approach the solution surface S first. When, as shown in FIG. 6(B), the crystal growth face G of the seed crystal 18 is made to contact the solution surface S, the projecting parts also end up contacting the solution surface S. In the end, in the illustrated example, the solution 14 of the seed crystal ends up contacting the front end part of the support rod 16 and the side faces of the seed crystal 18.

The front end face of the support rod 16 is preferably flat. Most preferably, the outer shape of the seed crystal 18 and the outer shape of the front end face match. Due to this, transmission of heat from the seed crystal to the support rod, which has a direct effect on the crystal growth, becomes uniform.

EXAMPLES

Example 1

A system for growing a single crystal which has the basic configuration which is shown in FIG. 2 was used.

A crucible 10 was charged with solid Si, Cr, and Ni, then a heating coil 12 was used to melt them to form an Si-20Cr-5Ni solution. Here, the Cr and Ni are additive elements for raising the solubility and do not contaminate the grown SiC single crystal.

The SiC seed crystal 18 uses the [0001] face as the crystal growth face. The angle β between the crystal growth face and side faces was made the most desirable 90°.

After the charged solids were completely melted and a solution was formed, the solution was held at a temperature of 1900° C. In that state, only the crystal growth face of the seed crystal was brought into contact with the solution surface.

Figure 7:
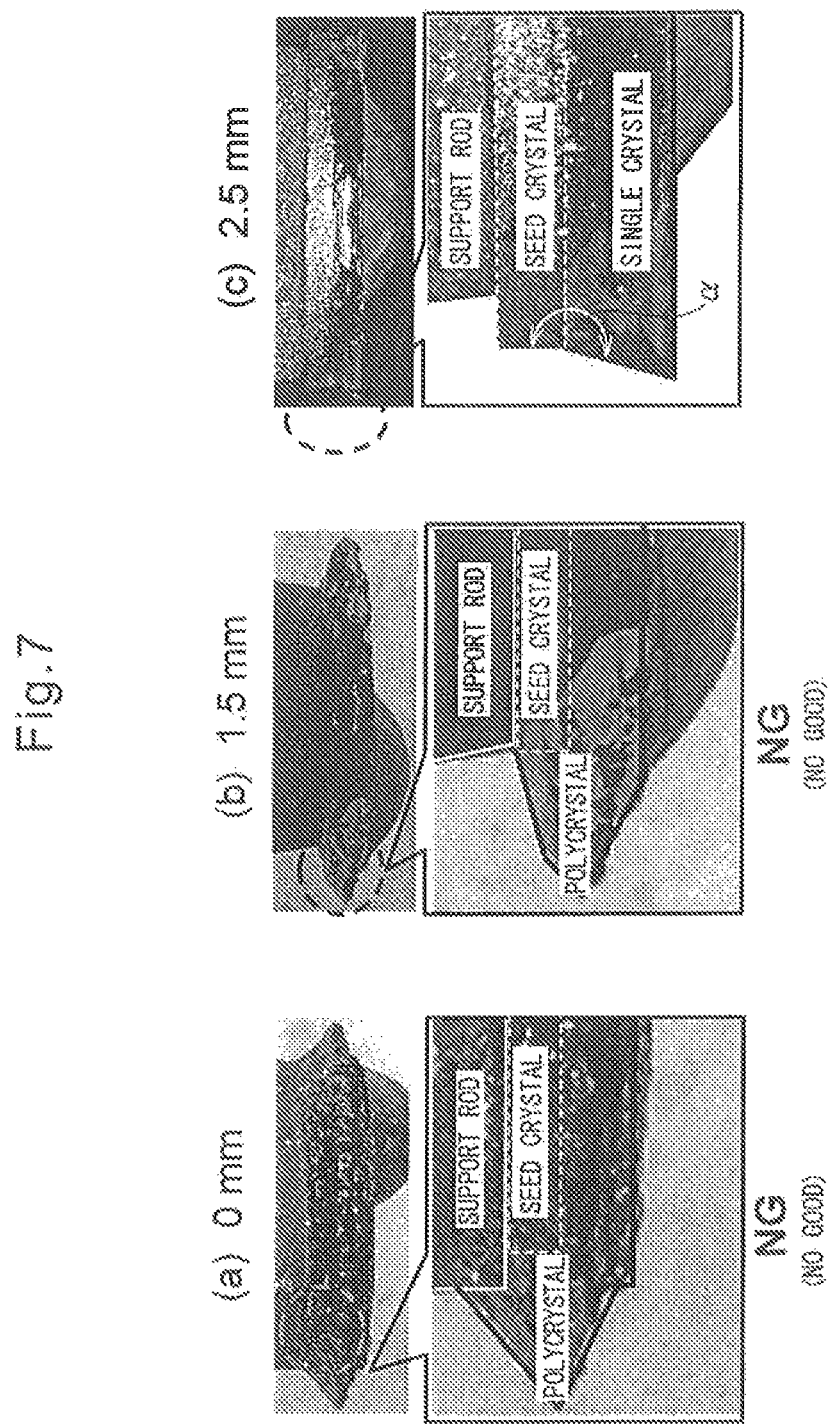
FIG. 7 is a photograph which shows the state of growth when growing the crystal while changing a pull-up height.

After contact, crystal growth was performed for 2 hours. At this time, the crystal was grown while changing the height "h" of the crystal growth face G of the seed crystal 18 from the solution surface S to (a) 0 mm, (b) 1.5 mm, and (c) 2.5 mm. The state of growth of the obtained crystal is shown in FIG. 7.

(a) In the case of a pull-up height "h"=0 mm, the solution 14 wetted not only the crystal growth face G but also the support rod 16. As a result, polycrystals 42 formed from the support rod 16 and the seed crystal 18 were completely covered.

(b) In the case of a pull-up height "h"=1.5 mm, polycrystals are not formed from the support rod 16, but polycrystals are formed from portions other than the crystal growth face G of the seed crystal 18.

(c) In the case of a pull-up height "h"=2.5 mm, crystal growth occurred from only the crystal growth face G of the seed crystal 18. Polycrystallization from the support rod 16 and the side faces of the seed crystal 18 could be prevented.

The contact angle α formed by the side faces of the seed crystal 18 and the meniscus 50 changes in accordance with the pull-up height "h". In addition to this example, the relationship between the contact angle α when changing the pull-up height "h" in the range of 0 to 3.5 mm and the presence of polycrystallization is shown in Table 1.

TABLE 1

(β = 90°)

| | Pull-up height "h" (mm) | | | | | | |
|---|---|---|---|---|---|---|---|
| | 0.5 | 1.0 | 1.5 | 2.0 | 2.5 | 3.0 | 3.5 |
| Contact angle α (°) | — | — | — | 197° | 194° | 175.6° | 130.4° |
| Polycrystals from side faces | Yes (no good) | Yes (no good) | Yes (no good) | No | No | No | No |
| Expansion angle (°) | — | — | — | 18.7 | 15.1 | −4.4 | −21.5 |

As shown in Table 1, if the pull-up height "h" is 2.0 mm or more and the contact angle α is 200 degrees or less, polycrystals are not formed. Among the parameters relating to polycrystallization, compared with the pull-up height "h", it is considered that the contact angle α is the more basic in relationship.

Figure 8:
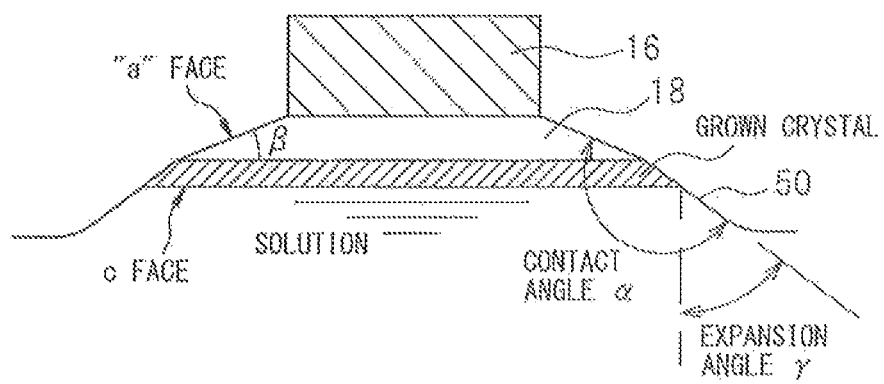
FIG. 8 is a schematic view which shows the relationship between portions during SiC growth.

Table 1 further shows an expansion angle γ which shows the expansion of the diameter of the crystal which is grown. As shown in FIG. 8, the expansion angle γ is the angle between the pull-up axis of the seed crystal 18 (vertical direction) and the meniscus 50 during crystal growth. If the expansion angle γ is a positive value, the crystal expands in diameter along with growth, while conversely if it is negative, the crystal contracts in diameter along with growth. The relationship between the expansion angle γ and the pull-up height "h" which is shown in Table 1 is plotted in FIG. 9.

Figure 9:
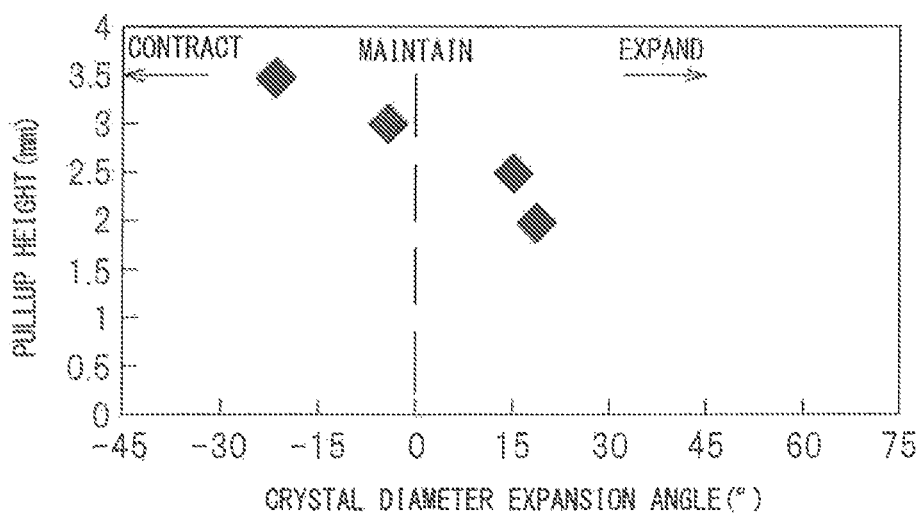
FIG. 9 is a graph which shows the relationship between the pull-up height and an expansion angle.

As shown in Table 1 and FIG. 9, along with the increase in the pull-up height "h", the expansion angle γ is reduced. When the pull-up height "h" is less than 3.0 mm, the expansion angle γ becomes 0° and the crystal diameter is maintained in diameter in the growth.

In this way, by setting the pull-up height "h", expansion of the diameter, contraction of the diameter, and maintenance of a constant diameter at the time of crystal growth can be selectively controlled.

Example 2

The same procedure was performed as in Example 2 to grow an SiC single crystal. However, the angle β between the crystal growth face G of the seed crystal 18 and the side faces was made 60 degrees. Further, the pull-up height was made 1.0 mm. The contact angle α was 180 degrees or under 200 degrees.

Figure 10:
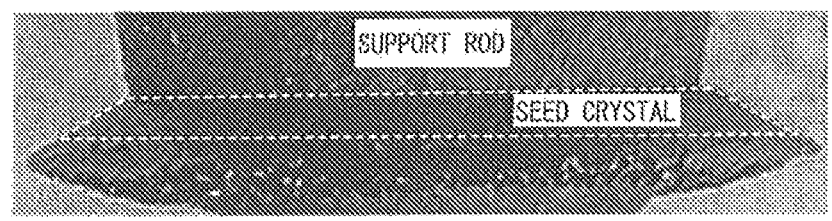
FIG. 10 is a photograph which shows an SiC single crystal which was grown according to the method of the present invention.

FIG. 10 shows the obtained SiC single crystal. There was no crystal growth other than from the crystal growth face G. Polycrystallization is prevented.

Example 3

The same procedure was performed as in Example 2 to grow an SiC single crystal. However, the angle β between the crystal growth face G of the seed crystal 18 and the side faces was changed in various ways. The obtained results are shown in Table 2.

TABLE 2

| | Angle β between growth face and side faces of seed crystal | | | | |
|---|---|---|---|---|---|
| | 30° | 60° | 90° | 120° | 150° |
| Polycrystals from side faces | No | No | No | Yes (no good) | Yes (no good) |

As shown in Table 2, when the angle β between the crystal growth face G of the seed crystal and the side faces is 90 degrees or less, polycrystallization is prevented.

Example 4

The same procedure was performed as in Example 1 to grow an SiC single crystal. However, the angle β between the crystal growth face G of the seed crystal 18 and the side faces was made 30 degrees. The crystal growth face G of the seed crystal and the solution surface S were brought into contact, then immediately the meniscus was formed. The pull-up height "h" was changed in the range of 0.5 to 1.5 mm and the crystal was grown for 2 hours. The rest of the conditions were made ones similar to Example 1.

TABLE 3

(β = 30°)

| | Pull-up height "h" (mm) | | | | | | |
|---|---|---|---|---|---|---|---|
| | 0.5 | 1 | 1.5 | 2 | 2.5 | 3 | 3.5 |
| Contact angle α (°) | 181 | 152.5 | 138.7 | — | — | — | — |
| Polycrystals from side faces | None | None | None | — | — | — | — |
| Expansion angle (°) | 61 | 32.5 | 23.2 | — | — | — | — |

Figure 11:
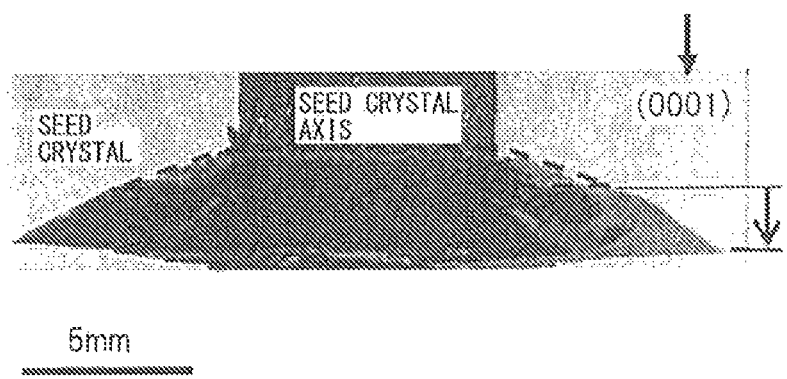
FIG. 11 is a photograph which shows an SiC single crystal which was grown according to the method of the present invention.

Due to this, as shown in FIG. 8 and FIG. 11, an SiC single crystal which was enlarged in diameter from the seed crystal 18 was obtained. There was no crystal growth other than from the crystal growth face G. It can be confirmed that polycrystallization from the side faces can be suppressed. The contact angle in this case is α=180° which satisfies the condition of being 200° or less.

Figure 12:
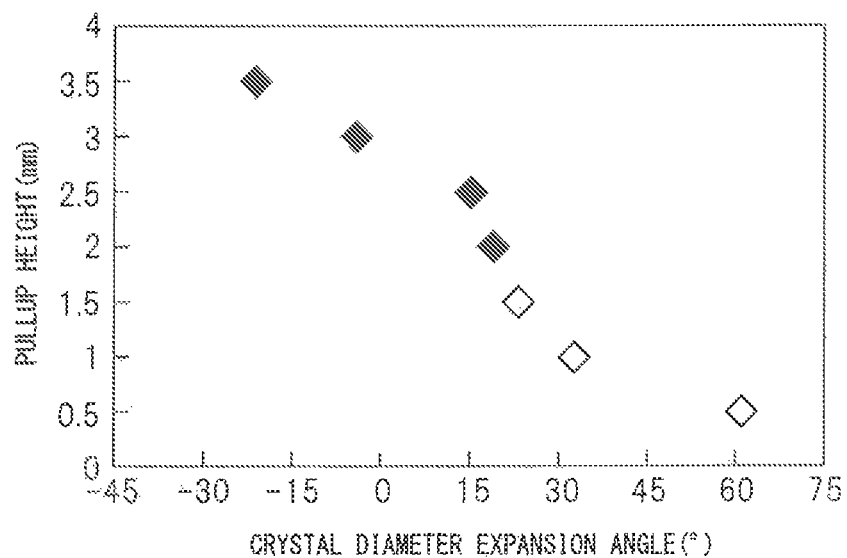
FIG. 12 is a graph which shows the relationship between the pull-up height and the expansion angle.

The obtained results are summarized in Table 3 and FIG. 12. However, in FIG. 12, the black diamond plot shows the result of the above Example 1 (β=90°). It is learned that the pull-up height can be adjusted to control the expansion angle.

Example 5

The same procedure was performed as in Example 1 to grow an SiC single crystal. However, an Si-23% Ti solution was used and the angle β between the crystal growth face G of the seed crystal 18 and the side faces was made 30 degrees. The crystal growth face G of the seed crystal and the solution surface S were brought into contact, then immediately the meniscus was formed. The pull-up height "h" was changed in the range of 2 to 5 mm and the crystal was grown for 2 hours. The rest of the conditions were made ones similar to Example 1.

Due to this, an SiC single crystal which was enlarged in diameter from the seed crystal was obtained. There was no crystal growth other than from the crystal growth face G. It can be confirmed that polycrystallization from the side faces can be suppressed. The contact angle in this case is α=180° which satisfies the condition of being 200° or less.

Figure 13:
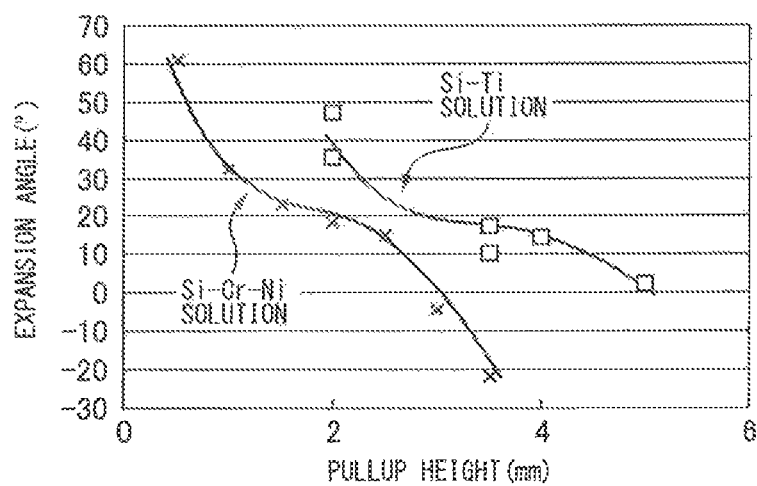
FIG. 13 is a graph which shows the relationship between the pull-up height and the expansion angle when using different compositions of solutions.

The obtained results are summarized in Table 4 and FIG. 13. In FIG. 13, for comparison, the result of the Si—Cr—Ni solution which is shown in FIG. 11 are also shown. However, the ordinate and abscissa are switched.

TABLE 4

|  | Pull-up height (h) mm | | | | | | | | | | | | |
|---|---|---|---|---|---|---|---|---|---|---|---|---|---|
| Solution | 2.0 | 2.0 | 3.5 | 3.5 | 4.0 | 5.0 | 0.5 | 1.0 | 1.5 | 2.0 | 2.5 | 3.0 | 3.5 |
| Expansion angle (°) Si—Cr—Ni |  |  |  |  |  |  | 61 | 32.5 | 23.2 | 18.7 | 15.1 | −4.4 | −21.5 |
| Si—Ti | 35.1 | 46.8 | 10.4 | 17.4 | 14.1 | 2.1 |  |  |  |  |  |  |  |

From the results of Table 4 and FIG. 13 as well, it will be understood that the pull-up height can be adjusted to control the expansion angle. At the same time, it is learned that the curve of the relationship between the expansion angle and the pull-up height shifts due to the composition of the solution. One reason of the shift is believed to be the viscosity of the solution. In this case, an Si—Ti solution is much more viscous than an Si—Cr—Ni solution.

Example 6

The same procedure was performed as in Example 1 to grow an SiC single crystal. The angle β between the crystal growth face G of the seed crystal 18 and the side faces was made the same 90 degrees. The crystal growth face G of the seed crystal and the solution surface S were brought into contact, then immediately the meniscus was formed. The pull-up height "h" was made 3.5 mm (constant), while the contact angle α between the side faces of the seed crystal 18 and the solution surface S was made 158.5°. During growth, the contact angle α was gradually made to increase and was made 195° at the time of the end of growth. The rest of the conditions were made ones similar to Example 1.

FIG. 14 shows the obtained SiC single crystal. It was confirmed that thru was no crystal growth other than at the crystal growth face G and that polycrystallization from the side faces could be suppressed. Further, it could be confirmed that the grown crystal diameter, if viewed over time, first was contracted, then was held constant, and finally was expanded.

Example 7

The above examples followed the best mode of the present invention which makes only the crystal growth face of the seed crystal contact the solution, that is, made the wetting height 0, to grow the SiC single crystal. In the present example, the general aspect of the present invention was used to find the allowable range of the wetting height.

That is, the same procedure was followed as in Example 1 to grow an SiC single crystal. However, the angle β between the crystal growth face G of the seed crystal 18 and the side faces was made 90 degrees. Further, the pull-up height was adjusted (1.0 mm to 3.0 mm) to change the wetting height in various ways (0 mm to 0.9 mm). The contact angle α was 180 degrees, that is, was less than 200 degrees.

FIGS. 15(1) to (4) show the obtained SiC single crystals. The results are shown together in Table 5.

TABLE 5

|  | Wetting of seed crystal side faces (mm) | | | |
|---|---|---|---|---|
|  | (1) 0 | (2) 0.3 | (3) 0.68 | (4) 0.9 |
| Macrodefects | No | No | Yes | Yes |

(1) When making the wetting height 0 mm (pull-up height 3.0 mm), that is, when bringing only the crystal growth face of the seed crystal into contact with the solution surface (best mode in the present invention), there was no crystal growth from portions other than the crystal growth face and an excellent SiC single crystal which is prevented from formation of macrodefects and polycrystallization was grown.

(2) When making the wetting height 0.3 mm (pull-up height 2.0 mm), the crystal which grows from the crystal growth face of the seed crystal (main crystal) and the crystal which grows from the side faces of the seed crystal (side face crystal) grew as an integral single crystal and, in the same way as (1), an excellent SiC single crystal which was prevented from formation of macrodefects and polycrystallization was grown.

(3) When making the wetting height 0.68 mm (pull-up height 1.5 mm), macrodefects formed between the main crystal and the side face crystals and a good SiC single crystal could not be grown.

(4) When making the wetting height 0.9 mm (pull-up height 1.0 mm), in the same way as (3), macrodefects formed between the main crystal and the side face crystals and a good SiC single crystal could not be grown.

In the case of the present embodiment, the allowable upper limit of the wetting height is a value in the range of 0.3 mm to 0.68 mm. Furthermore, if finely setting the wetting height and running experiments, a more detailed upper limit can be found.

That is, it is possible to run preliminary experiments to find the upper limit of the wetting height and set the pull-up height and other manufacturing parameters so that this is not exceeded and thereby grow the SiC single crystal.

In this way, the angle γ between the pull-up axis of the seed crystal 18 and the meniscus 50 can be used to control the rate of expansion or the rate of contraction of the diameter of the crystal which is grown.

Further, the pull-up height "h" of the seed crystal 18 can be used to control the angle γ between the pull-up axis and the meniscus 50.

Furthermore, a map which shows the relationship between the pull-up height "h" and the angle γ between the pull-up axis and the meniscus 50 can be prepared in advance and this map used to adjust the pull-up height "h" to adjust the angle between the pull-up axis and the meniscus 50.

INDUSTRIAL APPLICABILITY

According to the present invention, there are provided a method of production of an SiC single crystal by the solution method, which method of production of an SiC single crystal prevents polycrystallization where a large number of crystals grow in a scattered manner from faces of the seed crystal other than the crystal growth face or from a graphite rod which supports the seed crystal and a system of production by the same.

Furthermore, the parameters of the angle α between the side faces of the seed crystal and the solution surface, the angle β between the crystal growth face G of the seed crystal and the side faces, the angle (expansion angle) γ between the pull-up axis of the seed crystal and the meniscus during crystal growth, and the pull-up height "h" can be adjusted to prevent polycrystallization while performing selective control to expand, contract, or maintain constant the diameter of the grown crystal.

REFERENCE SIGNS LIST

10 graphite crucible
12 high frequency heating coil
14 solution
16 support rod
18 seed crystal
20 inert atmosphere
22 heat insulating material
24 radiant thermometer
26 thermocouple
30 control device
40 meniscus (formed by side faces of seed crystal and solution)
42 polycrystal
50 meniscus (formed by crystal growth face of seed crystal and solution)
G crystal growth face of seed crystal
S solution surface
h pull-up height
α contact angle of solution
β angle of crystal growth face of seed crystal and side faces

The invention claimed is:

1. A method of producing a SiC single crystal, in which a Si—C solution in a crucible is used to grow a SiC single crystal from a SiC seed crystal which has been brought into contact with a surface of the Si—C solution, comprising:
bringing the SiC seed crystal into contact with the solution surface and then pulling up the seed crystal, forming a meniscus between the seed crystal and the solution to obtain a wetting height of the solution to a side face of the SiC seed crystal is zero or within a range where a SiC single crystal which grows from a bottom face and a SiC single crystal which grows from the side face grow as an integral SiC single crystal, and growing the crystal in that state,
wherein an angle formed by the meniscus and the side face of the seed crystal is 200 degrees or less.

2. The method of producing a SiC single crystal of claim 1, wherein only the bottom face of the SiC seed crystal is brought into contact with the solution surface to make the wetting height 0.

3. The method of producing a SiC single crystal of claim 1, wherein the wetting height of the solution is less than 0.68 mm.

4. The method of producing a SiC single crystal of claim 3, further comprising:
controlling a rate of expansion or rate of contraction of the growing crystal with an angle between a pull-up axis of the seed crystal and the meniscus.

5. The method of producing a SiC single crystal of claim 4, wherein the angle between the pull-up axis and the meniscus is controlled with a pull-up height of the seed crystal.

6. The method of producing a SiC single crystal of claim 4, further comprising:
preparing in advance a map of the pull-up height of the seed crystal in relation to the angle between the pull-up axis of the seed crystal and the meniscus; and
adjusting the pull-up height so as to adjust the angle between the pull-up axis and the meniscus.

7. The method of producing a SiC single crystal of claim 1, further comprising:
maintaining a temperature gradient in the Si—C solution in the crucible such that the temperature decreases from the inside toward the solution surface.

8. The method of producing a SiC single crystal of claim 1, wherein an angle formed by the bottom face of the seed crystal and the side face is 90 degrees or less.

9. The method of producing a SiC single crystal of claim 1, wherein the bottom face of the seed crystal is the [0001] face or [000-1] face of the SiC crystal.

10. The method of producing a SiC single crystal of claim 2, wherein the bottom face of the seed crystal is brought into contact with the solution surface, and then the seed crystal is immediately pulled up to form the meniscus.

11. The method of producing a SiC single crystal of claim 10, wherein the seed crystal is rotated with respect to the solution surface when the seed crystal is pulled up to form the meniscus.

12. The method of producing a SiC single crystal of claim 1, further comprising:
vibrating the solution surface; and
utilizing the vibration to bring the solution surface and the bottom face of the seed crystal into contact.

* * * * *